United States Patent
Byun

(10) Patent No.: US 11,429,477 B2
(45) Date of Patent: Aug. 30, 2022

(54) SEMICONDUCTOR DEVICES

(71) Applicant: SK hynix Inc., Icheon-si (KR)

(72) Inventor: Hee Jin Byun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 370 days.

(21) Appl. No.: 16/719,274

(22) Filed: Dec. 18, 2019

(65) Prior Publication Data

US 2021/0055987 A1 Feb. 25, 2021

(30) Foreign Application Priority Data

Aug. 22, 2019 (KR) .................. 10-2019-0103362

(51) Int. Cl.
| | |
|---|---|
| G11C 29/00 | (2006.01) |
| G06F 11/10 | (2006.01) |
| G06F 13/16 | (2006.01) |
| G11C 8/10 | (2006.01) |
| G11C 7/10 | (2006.01) |

(52) U.S. Cl.
CPC ...... *G06F 11/1068* (2013.01); *G06F 13/1668* (2013.01); *G11C 7/1069* (2013.01); *G11C 7/1096* (2013.01); *G11C 8/10* (2013.01)

(58) Field of Classification Search
CPC ... G06F 11/1068; G06F 13/1668; G11C 8/10; G11C 7/1096; G11C 7/1069
See application file for complete search history.

(56) References Cited

U.S. PATENT DOCUMENTS

2011/0252288 A1* 10/2011 Sharon ............... G06F 11/1048
714/E11.006
2012/0221916 A1  8/2012 Schreck et al.
2018/0032395 A1*  2/2018 Yang .................. H04L 67/1097

FOREIGN PATENT DOCUMENTS

KR    1020140131851 A    11/2014

* cited by examiner

*Primary Examiner* — Samir W Rizk
(74) *Attorney, Agent, or Firm* — William Park & Associates Ltd.

(57) ABSTRACT

A semiconductor device includes first and second memory regions spaced apart from each other and a fail information storage region disposed between the first and second memory regions. A parity including error information on data is stored in a first parity region of the fail information storage region while a write operation is applied to the first memory region. The parity is stored in a second parity region of the fail information storage region while the write operation is applied to the second memory region. An error of the data is corrected by the parity stored in the first parity region while a read operation is applied to the first memory region. The error of the data is corrected by the parity stored in the second parity region while the read operation is applied to the second memory region.

27 Claims, 10 Drawing Sheets

FIG. 4

| WT | ADD<N> | WT_EN<1> | WT_EN<2> |
|---|---|---|---|
| H | L | H | L |
| H | H | L | H |
| L | X | L | L |

FIG. 6

| RD | ADD\<N\> | RD_EN\<1\> | RD_EN\<2\> |
|---|---|---|---|
| H | L | H | L |
| H | H | L | H |
| L | X | L | L |

SEMICONDUCTOR DEVICES

CROSS-REFERENCE TO RELATED APPLICATIONS

The present application claims priority under 35 U.S.C 119(a) to Korean Application No. 10-2019-0103362, filed on Aug. 22, 2019, which is incorporated herein by reference in its entirety.

BACKGROUND

1. Technical Field

Embodiments of the present disclosure relate to semiconductor devices, and more specifically to semiconductor devices for performing an error correction operation of data.

2. Related Art

Recently, a DDR2 scheme, a DDR3 scheme, a DDR4 scheme, and the like has been used to improve an operation speed of semiconductor devices. The DDR2 scheme, the DDR3 scheme, or the DDR4 scheme may be designed to receive or output multi-bit data, for example, 4-bit data, 8-bit data, 16-bit data, or 32-bit data during each clock cycle time. If a data transmission speed of the semiconductor devices becomes faster, the probability of error occurrence may increase while the data are transmitted in the semiconductor devices. Accordingly, advanced design schemes may be required to guarantee the reliable transmission of the data.

Whenever data are transmitted in semiconductor devices, error codes which are capable of detecting occurrence of errors may be generated and transmitted with the data to improve the reliability of data transmission. The error codes may include an error detection code (EDC) which is capable of detecting errors and an error correction code (ECC) which is capable of correcting the errors.

SUMMARY

According to an embodiment, a semiconductor device includes first and second memory regions spaced apart from each other and a fail information storage region disposed between the first and second memory regions. A parity including error information on data is stored in a first parity region of the fail information storage region while a write operation is applied to the first memory region. The parity is stored in a second parity region of the fail information storage region while the write operation is applied to the second memory region. An error of the data is corrected by the parity stored in the first parity region while a read operation is applied to the first memory region. The error of the data is corrected by the parity stored in the second parity region while the read operation is applied to the second memory region.

According to another embodiment, a semiconductor device includes a first memory region, a second memory region, and a first fail information storage region. The first and second memory regions are configured to store transmission data having "M"-number of bits during a write operation and configured to output the stored transmission data during a read operation. The first fail information storage region includes a first parity region and a second parity region which are configured to store a parity having "N"-number of bits during the write operation and configured to output the stored parity during the read operation. The first parity region is configured to store or output the parity generated during the write operation or the read operation which is applied to the first memory region, and the second parity region is configured to store or output the parity generated during the write operation or the read operation which is applied to the second memory region. Here, "N" and "M" represent natural numbers.

BRIEF DESCRIPTION OF THE DRAWINGS

FIG. 4 is a table illustrating an operation of the write control circuit shown in FIG. 3.

FIG. 6 is a table illustrating an operation of the read control circuit shown in FIG. 5.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
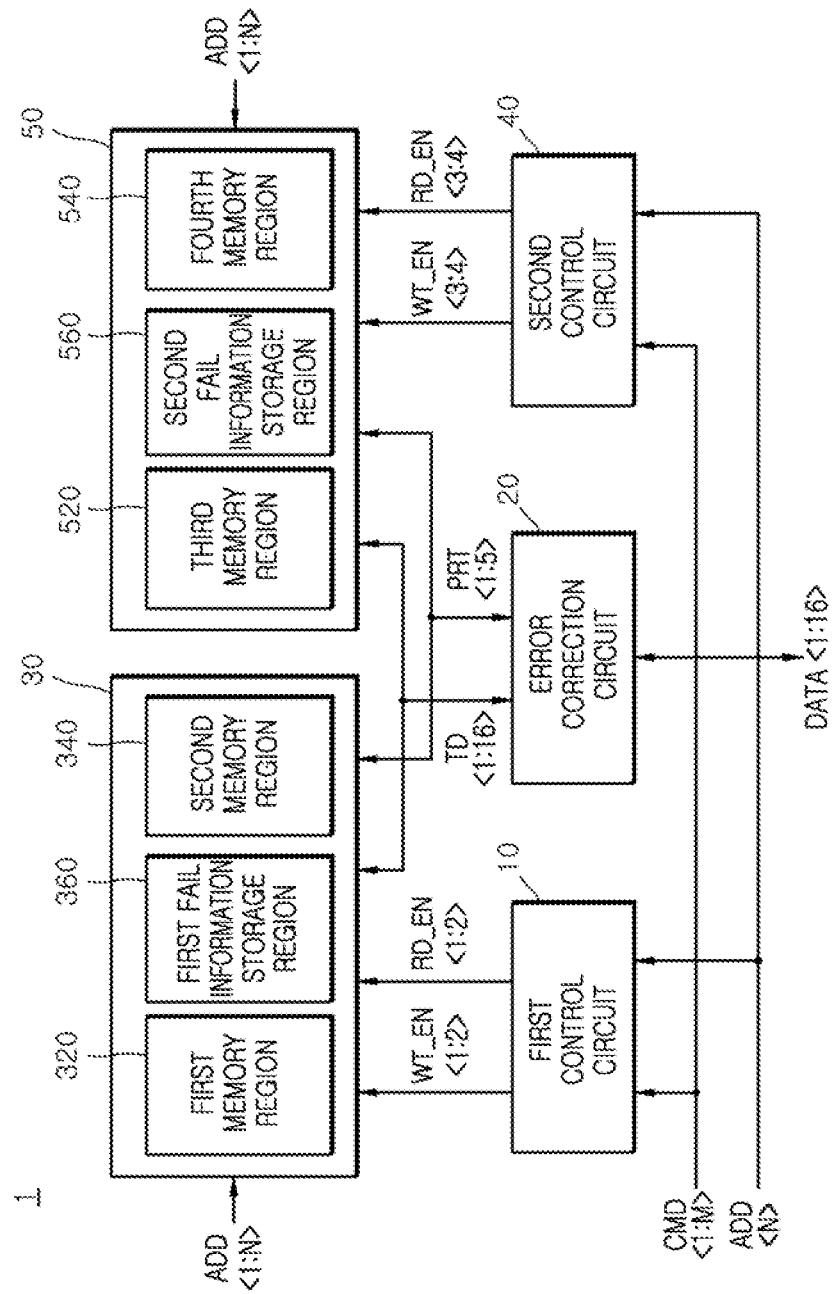
FIG. 1 is block diagram illustrating a configuration of a semiconductor device according to an embodiment of the present disclosure.

As illustrated in FIG. 1, a semiconductor device 1 according to an embodiment may include a first control circuit 10, an error correction circuit 20, a first core circuit 30, a second control circuit 40, and a second core circuit 50.

The first control circuit 10 may generate first and second write enablement signals WT_EN<1:2>, one of which is selectively enabled according to a logic level of an $N^{th}$ address signal ADD<N>, during a write operation activated by first to $M^{th}$ commands CMD<1:M>. The first control circuit 10 may generate first and second read enablement signals RD_EN<1:2>, one of which is selectively enabled according to a logic level of an $N^{th}$ address signal ADD<N>, during a read operation activated by the first to $M^{th}$ commands CMD<1:M>. The first to $M^{th}$ commands CMD<1:M> may be set as a signal having any one of various logic level combinations to perform the write operation or the read operation. The number "M" of bits included in the first to $M^{th}$ commands CMD<1:M> may be set to be different according to the embodiments. The $N^{th}$ address signal ADD<N> may be a signal for selecting any one of a first memory region 320 and a second memory region 340 included in the first core region 30 during the write operation or the read operation. The $N^{th}$ address signal ADD<N> may be a signal for selecting any one of a first memory region 320 and a second memory region 340 included in the first core region 30 during the write operation or the read operation. The $N^{th}$ address signal ADD<N> may be a signal for selecting any one of a third memory region 520 and a fourth memory region 540 included in the second core region 50 during the write operation or the read operation. The $N^{th}$ address signal ADD<N> for selecting the first and third memory regions 320 and 520 or the second and fourth memory regions 340 and 540 may be set to have a specific bit or at least two bits among bits included in first to $N^{th}$ address signals ADD<1:N> according to the embodiments. The number "N" of bits included in the first to $N^{th}$ address signals ADD<1:N> may be set to be different according to the embodiments.

The error correction circuit 20 may generate first to fifth parities PRT<1:5> of first to sixteenth data DATA<1:16> during the write operation. The error correction circuit 20 may generate first to sixteenth transmission data TD<1:16> from the first to sixteenth data DATA<1:16> during the write operation. The error correction circuit 20 may correct an error of the first to sixteenth transmission data TD<1:16> based on the first to fifth parities PRT<1:5> to generate and output the first to sixteenth data DATA<1:16> during the read operation. The error correction circuit 20 may generate the first to fifth parities PRT<1:5> including error information on the first to sixteenth data DATA<1:16> using an error correction code (ECC). The error correction circuit 20 may correct an error of the first to sixteenth transmission data TD<1:16> using the ECC based on the first to fifth parities PRT<1:5> to generate and output the first to sixteenth data DATA<1:16>.

The first core circuit 30 may include the first memory region 320, the second memory region 340, and a first fail information storage region 360.

The first memory region 320 may include a plurality of memory cells. The first memory region 320 may store the first to sixteenth transmission data TD<1:16> into memory cells selected by the first to $N^{th}$ address signals ADD<1:N> when the first write enablement signal WT_EN<1> is enabled during the write operation. The first memory region 320 may output the first to sixteenth transmission data TD<1:16> stored in memory cells selected by the first to $N^{th}$ address signals ADD<1:N> when the first read enablement signal RD_EN<1> is enabled during the read operation. Although FIG. 1 illustrates an example in which the first memory region 320 receives or outputs the first to sixteenth transmission data TD<1:16> having 16 bits during a single write operation or a single read operation, the number of bits included in the transmission data inputted to or outputted from the first memory region 320 by the single write operation or the single read operation may be set to be different according to the embodiments. The number "16" of bits of the first to sixteenth transmission data TD<1:16> inputted to or outputted from the first memory region 320 by the single write operation or the single read operation may be set by a burst length of 16.

The second memory region 340 may include a plurality of memory cells. The second memory region 340 may store the first to sixteenth transmission data TD<1:16> into memory cells selected by the first to $N^{th}$ address signals ADD<1:N> when the second write enablement signal WT_EN<2> is enabled during the write operation. The second memory region 340 may output the first to sixteenth transmission data TD<1:16> stored in memory cells selected by the first to $N^{th}$ address signals ADD<1:N> when the second read enablement signal RD_EN<2> is enabled during the read operation. Although FIG. 1 illustrates an example in which the second memory region 340 receives or outputs the first to sixteenth transmission data TD<1:16> having 16 bits during a single write operation or a single read operation, the number of bits included in the transmission data inputted to or outputted from the second memory region 340 by the single write operation or the single read operation may be set to be different according to the embodiments.

Figure 7:
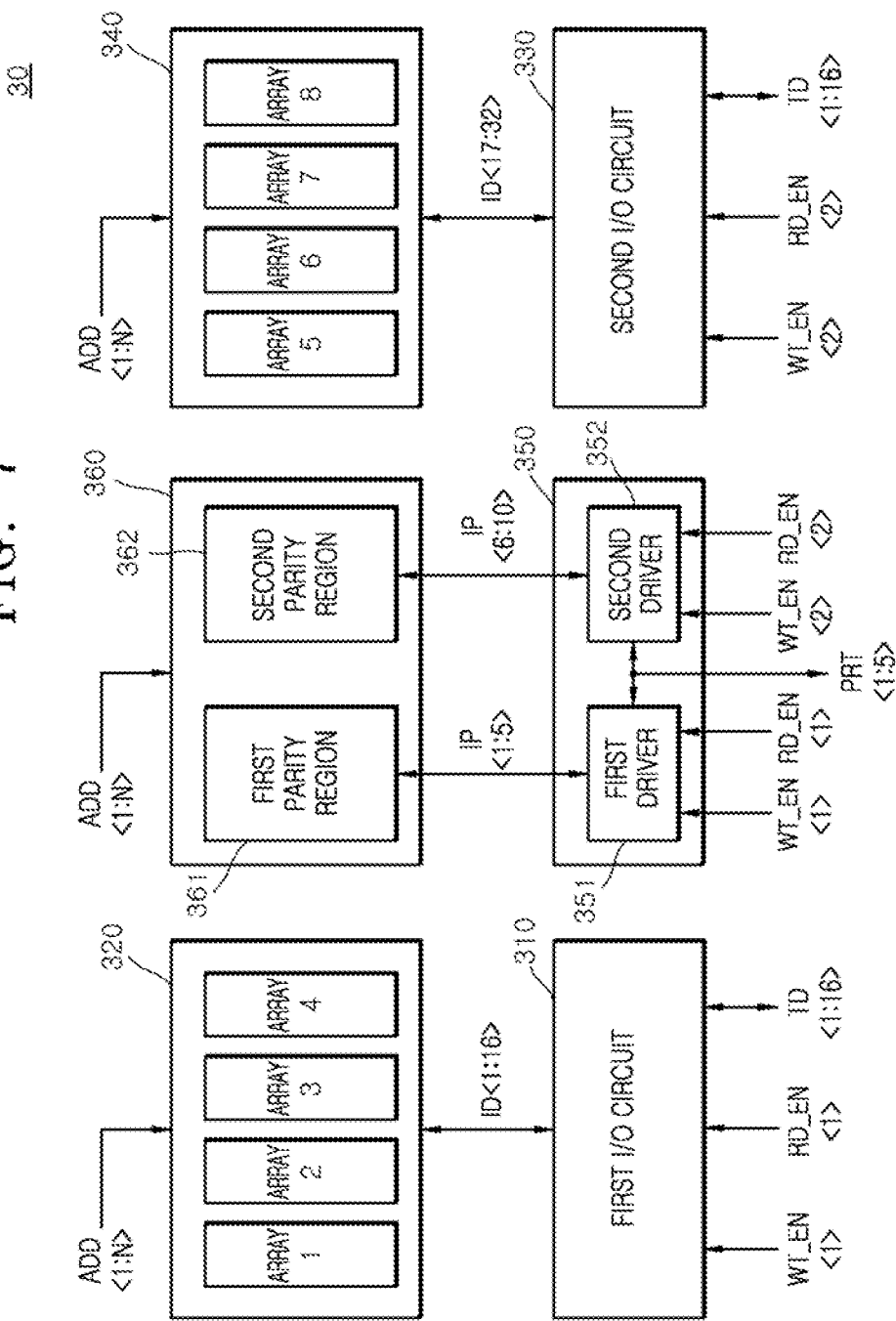
FIG. 7 is a block diagram illustrating a configuration of a first core circuit included in the semiconductor device of FIG. 1.

The first fail information storage region 360 may include a first parity region (361 of FIG. 7) and a second parity region (362 of FIG. 7). Each of the first parity region (361 of FIG. 7) and the second parity region (362 of FIG. 7) may include a plurality of memory cells.

The first parity region (361 of FIG. 7) may store the first to fifth parities PRT<1:5> into memory cells selected by the first to $N^{th}$ address signals ADD<1:N> when the first write enablement signal WT_EN<1> is enabled during the write operation. The first parity region (361 of FIG. 7) may output the first to fifth parities PRT<1:5> stored in memory cells selected by the first to $N^{th}$ address signals ADD<1:N> when the first read enablement signal RD_EN<1> is enabled during the read operation. Although FIG. 7 illustrates an example in which the first parity region (361 of FIG. 7) receives or outputs the first to fifth parities PRT<1:5> having 5 bits during a single write operation or a single read operation, the number of bits included in the parity inputted to or outputted from the first parity region (361 of FIG. 7) by the single write operation or the single read operation may be set to be different according to the embodiments.

The second parity region (362 of FIG. 7) may store the first to fifth parities PRT<1:5> into memory cells selected by the first to $N^{th}$ address signals ADD<1:N> when the second write enablement signal WT_EN<2> is enabled during the write operation. The second parity region (362 of FIG. 7) may output the first to fifth parities PRT<1:5> stored in memory cells selected by the first to $N^{th}$ address signals ADD<1:N> when the second read enablement signal RD_EN<2> is enabled during the read operation. Although FIG. 7 illustrates an example in which the second parity region (362 of FIG. 7) receives or outputs the first to fifth parities PRT<1:5> having 5 bits during a single write operation or a single read operation, the number of bits included in the parity inputted to or outputted from the second parity region (362 of FIG. 7) by the single write operation or the single read operation may be set to be different according to the embodiments.

A configuration and an operation of the first core circuit 30 is described in detail with reference to FIG. 7 later.

The second control circuit 40 may generate a third write enablement signal WT_EN<3> and a fourth write enablement signal WT_EN<4>, one of which is selected according to a logic level of the Nth address signal ADD<N>, while the write operation is activated by the first to $M^{th}$ commands CMD<1:M>. The second control circuit 40 may generate a third read enablement signal RD_EN<3> and a fourth read enablement signal RD_EN<4>, one of which is selected according to a logic level of the Nth address signal ADD<N>, while the read operation is activated by the first to $M^{th}$ commands CMD<1:M>.

The second core circuit 50 may include the third memory region 520, the fourth memory region 540, and a second fail information storage region 560.

The third memory region 520 may include a plurality of memory cells. The third memory region 520 may store the first to sixteenth transmission data TD<1:16> into memory cells selected by the first to $N^{th}$ address signals ADD<1:N> when the third write enablement signal WT_EN<3> is enabled during the write operation. The third memory region 520 may output the first to sixteenth transmission data TD<1:16> stored in memory cells selected by the first to $N^{th}$ address signals ADD<1:N> when the third read enablement signal RD_EN<3> is enabled during the read operation. Although FIG. 1 illustrates an example in which the third memory region 520 receives or outputs the first to sixteenth transmission data TD<1:16> having 16 bits during a single write operation or a single read operation, the number of bits included in the transmission data inputted to or outputted from the third memory region 520 by the single write operation or the single read operation may be set to be different according to the embodiments.

The fourth memory region 540 may include a plurality of memory cells. The fourth memory region 540 may store the first to sixteenth transmission data TD<1:16> into memory cells selected by the first to $N^{th}$ address signals ADD<1:N> when the fourth write enablement signal WT_EN<4> is enabled during the write operation. The fourth memory region 540 may output the first to sixteenth transmission data TD<1:16> stored in memory cells selected by the first to $N^{th}$ address signals ADD<1:N> when the fourth read enablement signal RD_EN<4> is enabled during the read operation. Although FIG. 1 illustrates an example in which the fourth memory region 540 receives or outputs the first to sixteenth transmission data TD<1:16> having 16 bits during a single write operation or a single read operation, the number of bits included in the transmission data inputted to or outputted from the fourth memory region 540 by the single write operation or the single read operation may be set to be different according to the embodiments.

The second fail information storage region 560 may include a third parity region (not shown) and a fourth parity region (not shown). Each of the third parity region (not shown) and the fourth parity region (not shown) may include a plurality of memory cells.

The third parity region (not shown) may store the first to fifth parities PRT<1:5> into memory cells selected by the first to $N^{th}$ address signals ADD<1:N> when the third write enablement signal WT_EN<3> is enabled during the write operation. The third parity region (not shown) may output the first to fifth parities PRT<1:5> stored in memory cells selected by the first to $N^{th}$ address signals ADD<1:N> when the third read enablement signal RD_EN<3> is enabled during the read operation. Although the present embodiment describes an example in which the third parity region (not shown) receives or outputs the first to fifth parities PRT<1:5> having 5 bits during a single write operation or a single read operation, the number of bits included in the parity inputted to or outputted from the third parity region (not shown) by the single write operation or the single read operation may be set to be different according to the embodiments.

The fourth parity region (not shown) may store the first to fifth parities PRT<1:5> into memory cells selected by the first to $N^{th}$ address signals ADD<1:N> when the fourth write enablement signal WT_EN<4> is enabled during the write operation. The fourth parity region (not shown) may output the first to fifth parities PRT<1:5> stored in memory cells selected by the first to $N^{th}$ address signals ADD<1:N> when the fourth read enablement signal RD_EN<4> is enabled during the read operation. Although the present embodiment describes an example in which the fourth parity region (not shown) receives or outputs the first to fifth parities PRT<1:5> having 5 bits during a single write operation or a single read operation, the number of bits included in the parity inputted to or outputted from the fourth parity region (not shown) by the single write operation or the single read operation may be set to be different according to the embodiments.

According to the embodiment described above, the number "16" of bits included in the data inputted to or outputted from the semiconductor device at a single time during the write operation or the read operation may be set by a burst length of 16, and the number of bits included in the parity may be set to be "5" when the burst length is 16. In another embodiment, the number of bits included in the parity may be set to be "6" when the number of bits included in the data inputted to or outputted from the semiconductor device at a single time during the write operation or the read operation is set to be "32". That is, if the number of bits of data increases by twice (e.g., from "M" into "2×M"), the number of bits of parity may increase by "1" (e.g., from "N" into "N+1").

Figure 2:
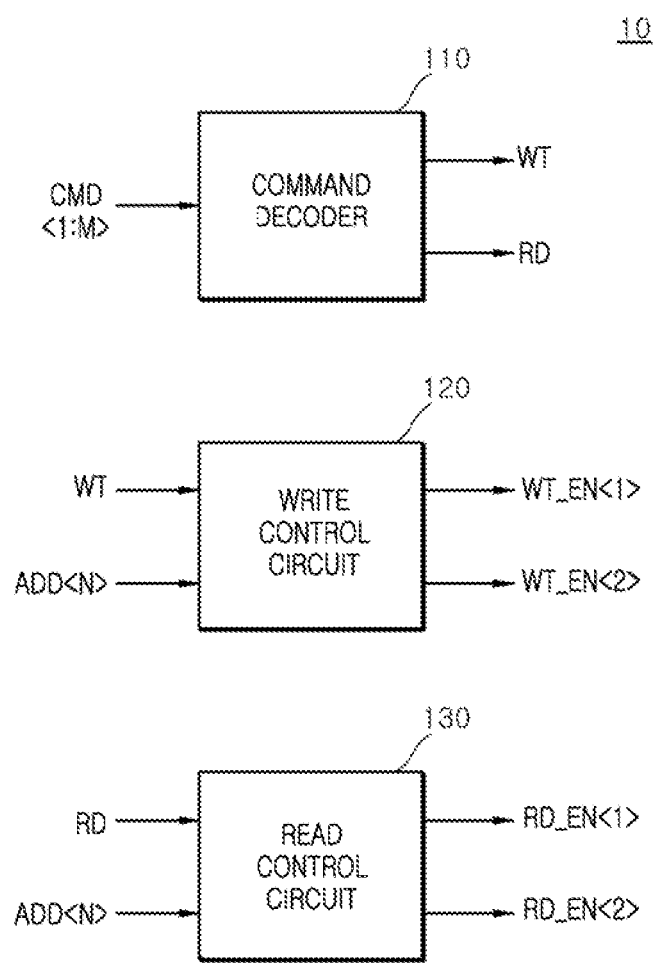
FIG. 2 is a block diagram illustrating a configuration of a first control circuit included in the semiconductor device of FIG. 1.

Referring to FIG. 2, the first control circuit 10 may include a command decoder 110, a write control circuit 120, and a read control circuit 130.

The command decoder 110 may decode the first to $M^{th}$ commands CMD<1:M> to generate a write signal WT which is enabled to activate the write operation. The command decoder 110 may decode the first to $M^{th}$ commands CMD<1:M> to generate a read signal RD which is enabled to activate the read operation.

The write control circuit 120 may generate the first write enablement signal WT_EN<1> and the second write enablement signal WT_EN<2>, one of which is selectively enabled according to a logic level of the $N^{th}$ address signal ADD<N> when the write signal WT is inputted to the write control circuit 120. The write control circuit 120 may generate the first write enablement signal WT_EN<1> which is enabled when the write signal WT is inputted to the write control circuit 120 and the $N^{th}$ address signal ADD<N> is generated to have a first logic level. The write control circuit 120 may generate the second write enablement signal WT_EN<2> which is enabled when the write signal WT is inputted to the write control circuit 120 and the $N^{th}$ address signal ADD<N> is generated to have a second logic level. In an embodiment, the first logic level may be set as a logic "low" level, and the second logic level may be set as a logic "high" level.

The read control circuit 130 may generate the first read enablement signal RD_EN<1> and the second read enablement signal RD_EN<2>, one of which is selectively enabled according to a logic level of the $N^{th}$ address signal ADD<N> when the read signal RD is inputted to the read control circuit 130. The read control circuit 130 may generate the first read enablement signal RD_EN<1> which is enabled when the read signal RD is inputted to the read control circuit 130 and the $N^{th}$ address signal ADD<N> is generated to have the first logic level. The read control circuit 130 may generate the second read enablement signal RD_EN<2> which is enabled when the read signal RD is inputted to the read control circuit 130 and the $N^{th}$ address signal ADD<N> is generated to have the second logic level.

The second control circuit 40 illustrated in FIG. 1 may be realized to have substantially the same configuration as the first control circuit 10 illustrated in FIG. 2 except input/output (I/O) signals thereof. Thus, a detailed description of the second control circuit 40 is omitted hereinafter.

Figure 3:
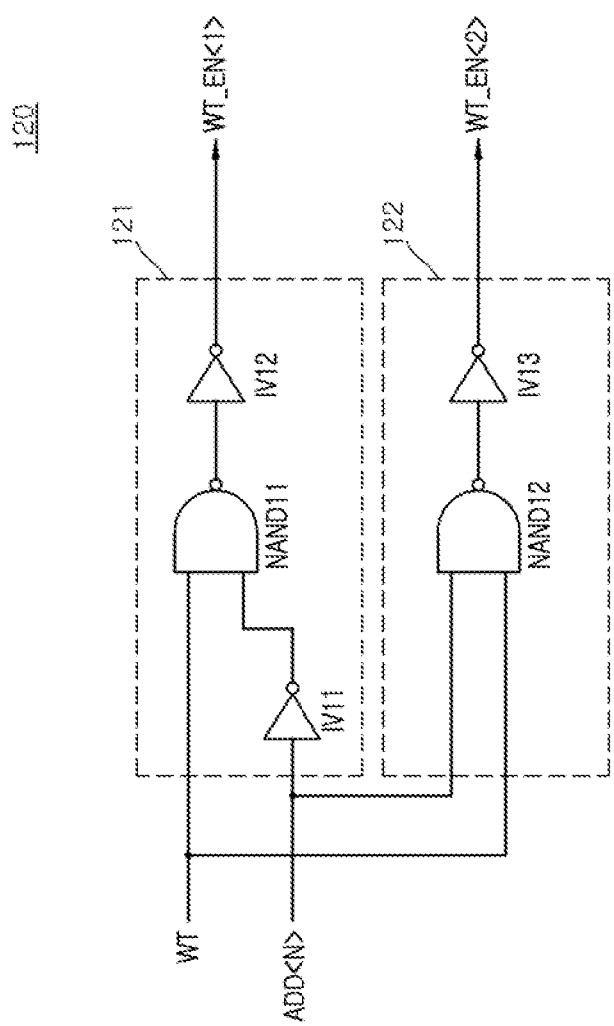
FIG. 3 is a circuit diagram illustrating a configuration of a write control circuit included in the first control circuit of FIG. 2.

Referring to FIG. 3, the write control circuit 120 may include a first logic circuit 121 and a second logic circuit 122.

The first logic circuit 121 may be realized using inverters IV11 and IV12 and a NAND gate NAND11. The first logic circuit 121 may inversely buffer the $N^{th}$ address signal ADD<N> to generate the first write enablement signal WT_EN<1> when the write signal WT is enabled to have a logic "high" level.

The second logic circuit 122 may be realized using a NAND gate NAND12 and an inverter IV13. The second logic circuit 122 may buffer the $N^{th}$ address signal ADD<N> to generate the second write enablement signal WT_EN<2> when the write signal WT is enabled to have a logic "high" level.

Figure 4:
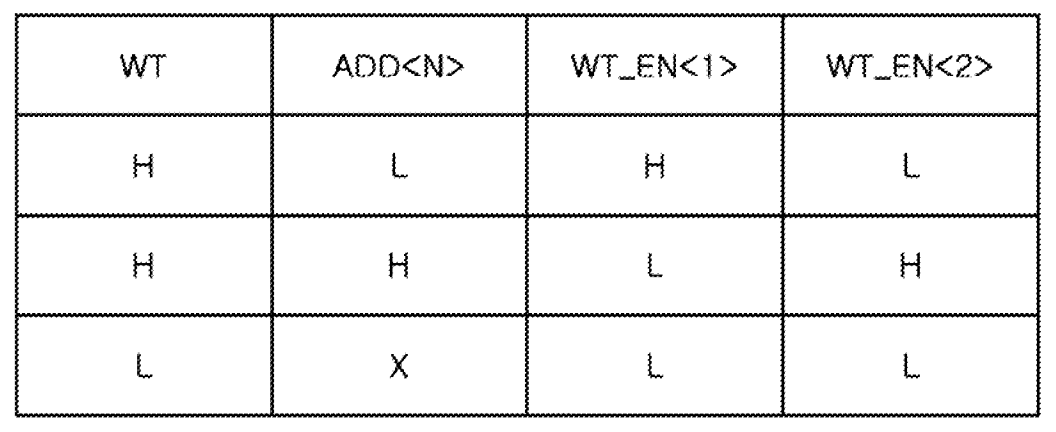

An operation of the write control circuit 120 is described more fully hereinafter with reference to FIG. 4.

The write control circuit 120 may generate the first write enablement signal WT_EN<1> which is enabled to have a logic "high(H)" level when the write signal WT has a logic "high(H)" level and the $N^{th}$ address signal ADD<N> has a logic "low(L)" level.

The write control circuit 120 may generate the second write enablement signal WT_EN<2> which is enabled to have a logic "high(H)" level when the write signal WT has a logic "high(H)" level and the $N^{th}$ address signal ADD<N> has a logic "high(H)" level.

The write control circuit 120 may generate the first and second write enablement signals WT_EN<1:2> which are disabled to have a logic "low(L)" level regardless of a logic level of the $N^{th}$ address signal ADD<N> when the write signal WT is disabled to have a logic "low(L)" level.

Figure 5:
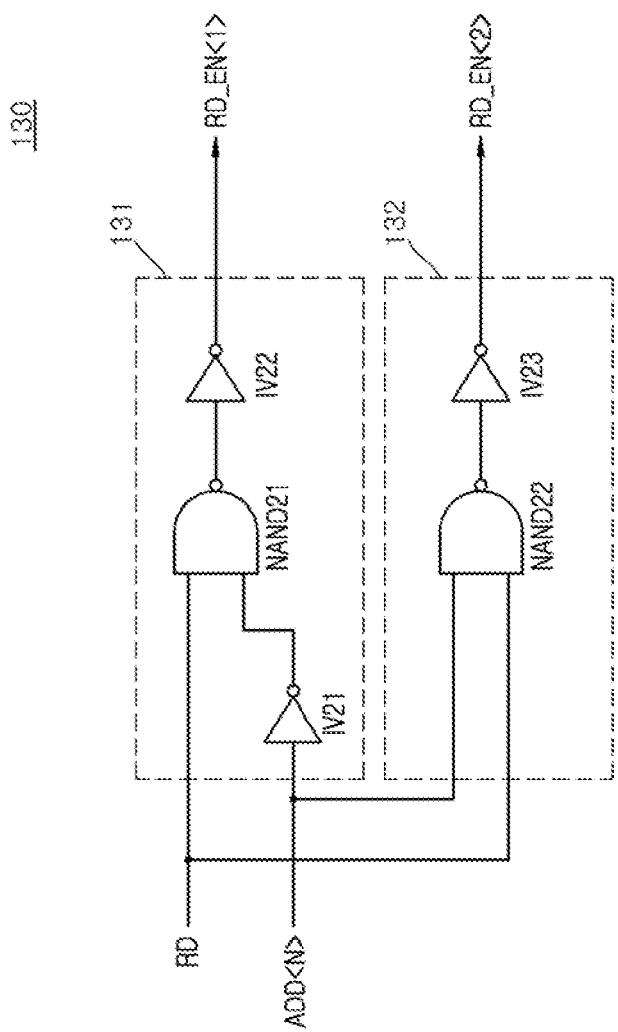
FIG. 5 is a circuit diagram illustrating a configuration of a read control circuit included in the first control circuit of FIG. 2.

Referring to FIG. 5, the read control circuit 130 may include a third logic circuit 131 and a fourth logic circuit 132.

The third logic circuit 131 may be realized using inverters IV21 and IV22 and a NAND gate NAND21. The third logic circuit 131 may inversely buffer the $N^{th}$ address signal ADD<N> to generate the first read enablement signal RD_EN<1> when the read signal RD is enabled to have a logic "high" level.

The fourth logic circuit 132 may be realized using a NAND gate NAND22 and an inverter IV23. The fourth logic circuit 132 may buffer the $N^{th}$ address signal ADD<N> to generate the second read enablement signal RD_EN<2> when the read signal RD is enabled to have a logic "high" level.

Figure 6:
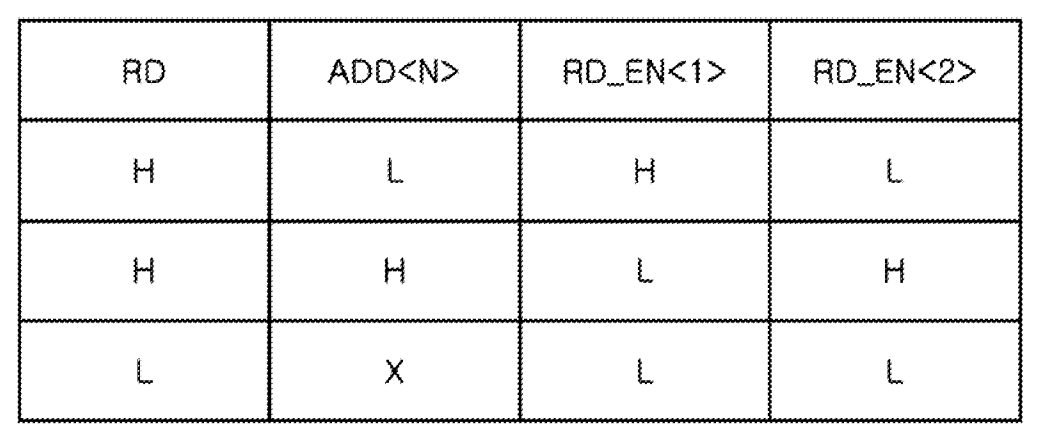

An operation of the read control circuit 130 is described more fully hereinafter with reference to FIG. 6.

The read control circuit 130 may generate the first read enablement signal RD_EN<1> which is enabled to have a logic "high(H)" level when the read signal RD has a logic "high(H)" level and the $N^{th}$ address signal ADD<N> has a logic "low(L)" level.

The read control circuit 130 may generate the second read enablement signal RD_EN<2> which is enabled to have a logic "high(H)" level when the read signal RD has a logic "high(H)" level and the $N^{th}$ address signal ADD<N> has a logic "high(H)" level.

The read control circuit 130 may generate the first and second read enablement signals RD_EN<1:2> which are disabled to have a logic "low(L)" level regardless of a logic level of the $N^{th}$ address signal ADD<N> when the read signal RD is disabled to have a logic "low(L)" level.

Referring to FIG. 7, the first core circuit 30 may include a first I/O circuit 310, the first memory region 320, a second I/O circuit 330, the second memory region 340, a parity I/O circuit 350, and the first fail information storage region 360.

The first I/O circuit 310 may generate first to sixteenth internal data ID<1:16> from the first to sixteenth transmission data TD<1:16> during the write operation applied to the first memory region 320. The first I/O circuit 310 may generate the first to sixteenth internal data ID<1:16> from the first to sixteenth transmission data TD<1:16> when the first write enablement signal WT_EN<1> is enabled. The first I/O circuit 310 may generate the first to sixteenth transmission data TD<1:16> from the first to sixteenth internal data ID<1:16> during the read operation applied to the first memory region 320. The first I/O circuit 310 may generate the first to sixteenth transmission data TD<1:16> from the first to sixteenth internal data ID<1:16> when the first read enablement signal RD_EN<1> is enabled.

The first memory region 320 may include a first array ARRAY1, a second array ARRAY2, a third array ARRAY3, and a fourth array ARRAY4. Each of the first to fourth arrays ARRAY1, ARRAY2, ARRAY3 and ARRAY4 may include a plurality of memory cells.

The first memory region 320 may store the first to sixteenth internal data ID<1:16> into memory cells included in the first to fourth arrays ARRAY1, ARRAY2, ARRAY3 and ARRAY4, which are selected by the first to $N^{th}$ address signals ADD<1:N>, during the write operation. The first memory region 320 may output the first to sixteenth internal data ID<1:16> stored in memory cells included in the first to fourth arrays ARRAY1, ARRAY2, ARRAY3 and ARRAY4, which are selected by the first to $N^{th}$ address signals ADD<1:N>, during the read operation. Although FIG. 7 illustrates an example in which the first memory region 320 includes the first to fourth arrays ARRAY1, ARRAY2, ARRAY3, and ARRAY4, the number of the arrays may be set to be different according to the embodiments.

The second I/O circuit 330 may generate seventeenth to thirty second internal data ID<17:32> from the first to sixteenth transmission data TD<1:16> during the write operation applied to the second memory region 340. The second I/O circuit 330 may generate the seventeenth to thirty second internal data ID<17:32> from the first to sixteenth transmission data TD<1:16> when the second write enablement signal WT_EN<2> is enabled. The second I/O circuit 330 may generate the first to sixteenth transmission data TD<1:16> from the seventeenth to thirty second internal data ID<17:32> during the read operation applied to the second memory region 340. The second I/O circuit 330 may generate the first to sixteenth transmission data TD<1:16> from the seventeenth to thirty second internal data ID<17:32> when the second read enablement signal RD_EN<2> is enabled.

The second memory region 340 may include a fifth array ARRAY5, a sixth array ARRAY6, a seventh array ARRAY7, and an eighth array ARRAY8. Each of the fifth to eighth arrays ARRAY5, ARRAY6, ARRAY7 and ARRAY8 may include a plurality of memory cells.

The second memory region 340 may store the seventeenth to thirty second internal data ID<17:32> into memory cells included in the fifth to eighth arrays ARRAY5, ARRAY6, ARRAY7 and ARRAY8, which are selected by the first to $N^{th}$ address signals ADD<1:N>, during the write operation. The second memory region 340 may output the seventeenth to thirty second internal data ID<17:32> stored in memory cells included in the fifth to eighth arrays ARRAY5, ARRAY6, ARRAY7 and ARRAY8, which are selected by the first to $N^{th}$ address signals ADD<1:N>, during the read operation. Although FIG. 7 illustrates an example in which the second memory region 340 includes the fifth to eighth arrays ARRAY5, ARRAY6, ARRAY7, and ARRAY8, the number of the arrays may be set to be different according to the embodiments.

The parity I/O circuit 350 may include a first driver 351 and a second driver 352.

The first driver 351 may generate first to fifth internal parities IP<1:5> from the first to fifth parities PRT<1:5> when the first write enablement signal WT_EN<1> is enabled. The first driver 351 may generate the first to fifth parities PRT<1:5> from the first to fifth internal parities IP<1:5> when the first read enablement signal RD_EN<1> is enabled.

The second driver 352 may generate sixth to tenth internal parities IP<6:10> from the first to fifth parities PRT<1:5> when the second write enablement signal WT_EN<2> is enabled. The second driver 352 may generate the first to fifth parities PRT<1:5> from the sixth to tenth internal parities IP<6:10> when the second read enablement signal RD_EN<2> is enabled.

As described above, the parity I/O circuit 350 may generate the first to fifth internal parities IP<1:5> from the first to fifth parities PRT<1:5> during the write operation applied to the first memory region 320. The parity I/O circuit 350 may generate the first to fifth parities PRT<1:5> from the first to fifth internal parities IP<1:5> during the read operation applied to the first memory region 320. The parity I/O circuit 350 may generate the sixth to tenth internal parities IP<6:10> from the first to fifth parities PRT<1:5> during the write operation applied to the second memory region 340. The parity I/O circuit 350 may generate the first to fifth parities PRT<1:5> from the sixth to tenth internal parities IP<6:10> during the read operation applied to the second memory region 340.

The first fail information storage region 360 may include the first parity region 361 and the second parity region 362. Each of the first parity region 361 and the second parity region 362 may include a plurality of memory cells.

The first parity region 361 may store the first to fifth internal parities IP<1:5> into memory cells selected by the first to $N^{th}$ address signals ADD<1:N> during the write operation. The first parity region 361 may output the first to fifth internal parities IP<1:5> stored in memory cells selected by the first to $N^{th}$ address signals ADD<1:N> during the read operation.

The second parity region 362 may store the sixth to tenth internal parities IP<6:10> into memory cells selected by the first to $N^{th}$ address signals ADD<1:N> during the write operation. The second parity region 362 may output the sixth to tenth internal parities IP<6:10> stored in memory cells selected by the first to $N^{th}$ address signals ADD<1:N> during the read operation.

The first fail information storage region 360 may be disposed between the first memory region 320 and the second memory region 340. In addition, the first parity region 361 may be disposed to be adjacent to the first memory region 320, and the second parity region 362 may be disposed to be adjacent to the second memory region 340.

Meanwhile, the second core circuit 50 illustrated in FIG. 1 may be realized to have substantially the same configuration as the first core circuit 30 illustrated in FIG. 7 except input/output (I/O) signals thereof. Thus, a detailed description of the second core circuit 50 is omitted hereinafter.

Figure 8:
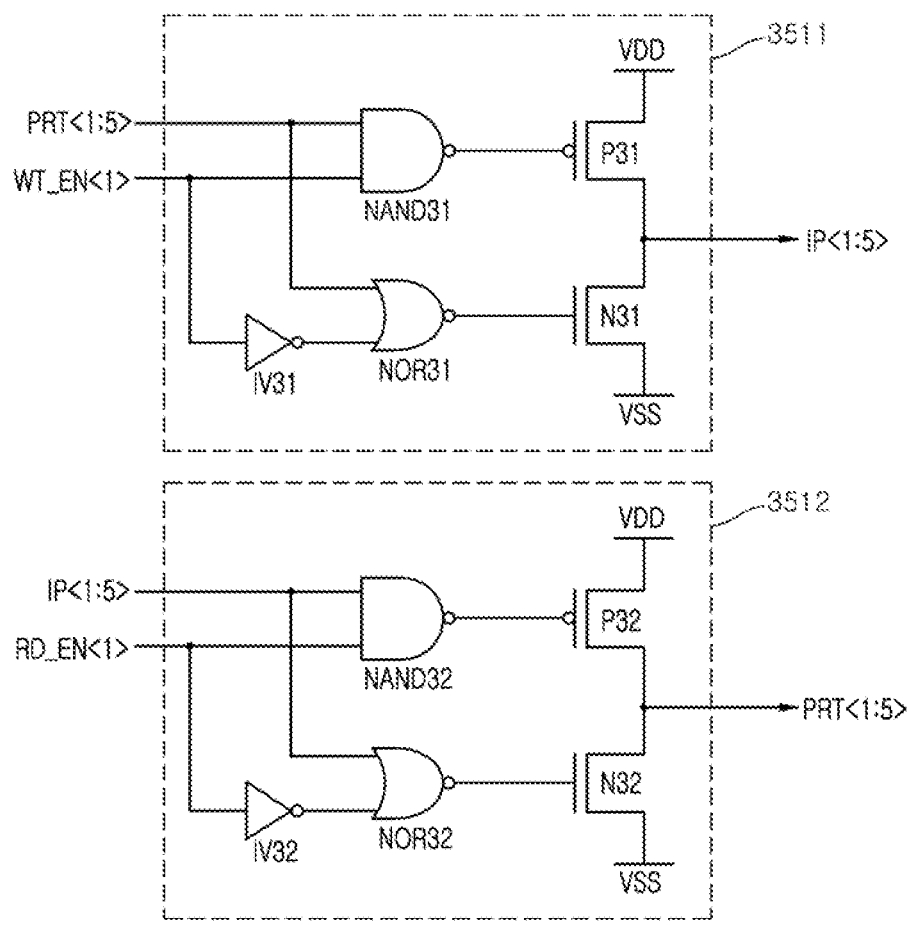
FIG. 8 is a circuit diagram illustrating a configuration of a first driver included in the first core circuit of FIG. 7.

Referring to FIG. 8, the first driver 351 may include a first write driver 3511 and a first read driver 3512.

The first write driver 3511 may be realized using an inverter IV31, a NAND gate NAND31, a NOR gate NOR31, a PMOS transistor P31, and an NMOS transistor N31. The first write driver 3511 may buffer the first to fifth parities PRT<1:5> to generate the first to fifth internal parities IP<1:5> when the first write enablement signal WT_EN<1> is enabled to have a logic "high" level.

The first read driver 3512 may be realized using an inverter IV32, a NAND gate NAND32, a NOR gate NOR32, a PMOS transistor P32, and an NMOS transistor N32. The first read driver 3512 may buffer the first to fifth internal parities IP<1:5> to generate the first to fifth parities PRT<1:5> when the first read enablement signal RD_EN<1> is enabled to have a logic "high" level.

Figure 9:
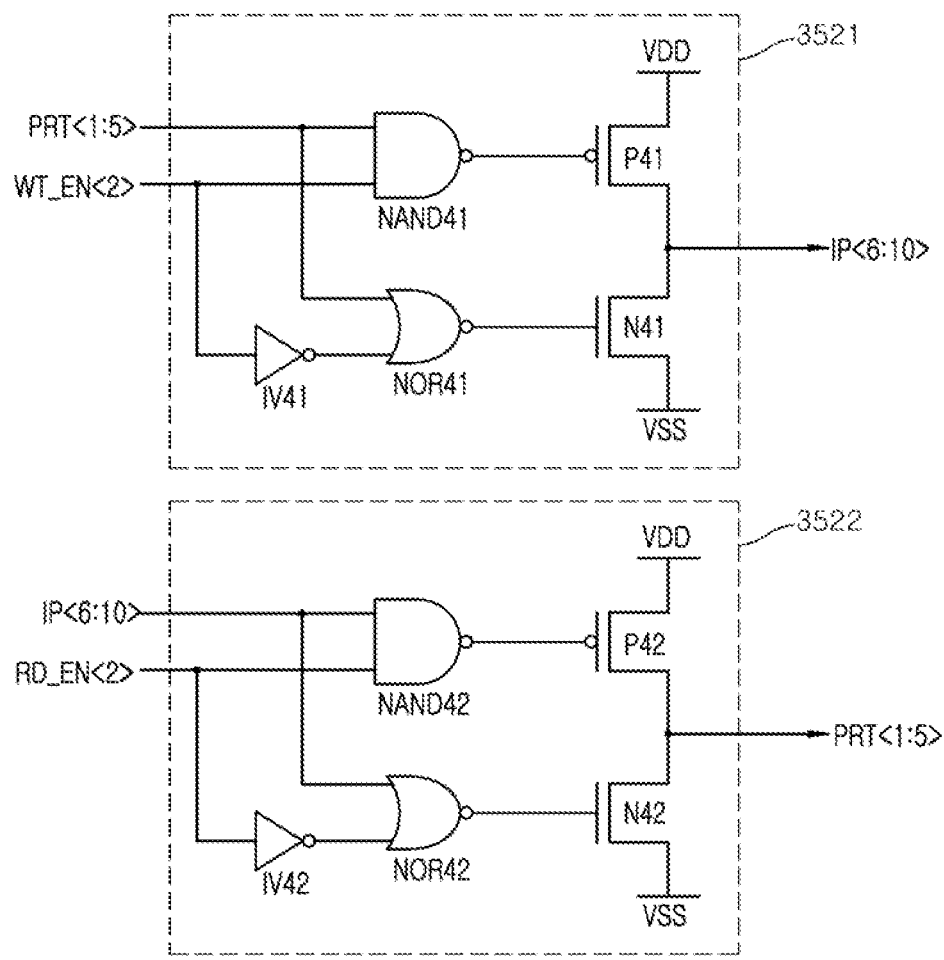
FIG. 9 is a circuit diagram illustrating a configuration of a second driver included in the first core circuit of FIG. 7.

Referring to FIG. 9, the second driver 352 may include a second write driver 3521 and a second read driver 3522.

The second write driver 3521 may be realized using an inverter IV41, a NAND gate NAND41, a NOR gate NOR41, a PMOS transistor P41, and an NMOS transistor N41. The second write driver 3521 may buffer the first to fifth parities PRT<1:5> to generate the sixth to tenth internal parities IP<6:10> when the second write enablement signal WT_EN<2> is enabled to have a logic "high" level.

The second read driver 3522 may be realized using an inverter IV42, a NAND gate NAND42, a NOR gate NOR42, a PMOS transistor P42, and an NMOS transistor N42. The second read driver 3522 may buffer the sixth to tenth internal parities IP<6:10> to generate the first to fifth parities PRT<1: 5> when the second read enablement signal RD_EN<2> is enabled to have a logic "high" level.

Operations of the semiconductor device 1 having the aforementioned configuration is described hereinafter with reference to FIGS. 1 to 9 in conjunction with the write operation and the read operation applied to the first core circuit 30.

First, in order to perform the write operation applied to the first memory region 320 of the first core circuit 30, the command decoder 110 may decode the first to $M^{th}$ commands CMD<1:M> to generate the write signal WT which is enabled to have a logic "high" level.

The write control circuit 120 may generate the first write enablement signal WT_EN<1> which is enabled to have a logic "high" level based on the write signal WT having a logic "high" level and the $N^{th}$ address signal ADD<N> having a logic "low" level.

The error correction circuit 20 may generate the first to sixteenth transmission data TD<1:16> from the first to sixteenth data DATA<1:16>. The error correction circuit 20 may generate the first to fifth parities PRT<1:5> including an error of the first to sixteenth data DATA<1:16> using an error correction code (ECC).

The first I/O circuit 310 may generate the first to sixteenth internal data ID<1:16> from the first to sixteenth transmission data TD<1:16> because the first write enablement signal WT_EN<1> is enabled to have a logic "high" level.

The first memory region 320 may store the first to sixteenth internal data ID<1:16> into memory cells included in the first to fourth arrays ARRAY1~ARRAY4, which are selected by the first to $N^{th}$ address signals ADD<1:N>.

The first driver 351 of the parity I/O circuit 350 may generate the first to fifth internal parities IP<1:5> from the first to fifth parities PRT<1:5> because the first write enablement signal WT_EN<1> is enabled to have a logic "high" level.

The first parity region 361 of the first fail information storage region 360 may store the first to fifth internal parities IP<1:5> into memory cells selected by the first to $N^{th}$ address signals ADD<1:N>.

Next, in order to perform the write operation applied to the second memory region 340 of the first core circuit 30, the command decoder 110 may decode the first to $M^{th}$ commands CMD<1:M> to generate the write signal WT which is enabled to have a logic "high" level.

The write control circuit 120 may generate the second write enablement signal WT_EN<2> which is enabled to have a logic "high" level based on the write signal WT having a logic "high" level and the $N^{th}$ address signal ADD<N> having a logic "high" level.

The error correction circuit 20 may generate the first to sixteenth transmission data TD<1:16> from the first to sixteenth data DATA<1:16>. The error correction circuit 20 may generate the first to fifth parities PRT<1:5> including an error of the first to sixteenth data DATA<1:16> using an error correction code (ECC).

The second I/O circuit 330 may generate the seventeenth to thirty second internal data ID<17:32> from the first to sixteenth transmission data TD<1:16> because the second write enablement signal WT_EN<2> is enabled to have a logic "high" level.

The second memory region 340 may store the seventeenth to thirty second internal data ID<17:32> into memory cells included in the fifth to eighth arrays ARRAY5~ARRAY8, which are selected by the first to $N^{th}$ address signals ADD<1:N>.

The second driver 352 of the parity I/O circuit 350 may generate the sixth to tenth internal parities IP<6:10> from the first to fifth parities PRT<1:5> because the second write enablement signal WT_EN<2> is enabled to have a logic "high" level.

The second parity region 362 of the first fail information storage region 360 may store the sixth to tenth internal parities IP<6:10> into memory cells selected by the first to $N^{th}$ address signals ADD<1:N>.

Subsequently, in order to perform the read operation applied to the first memory region 320 of the first core circuit 30, the command decoder 110 may decode the first to $M^{th}$ commands CMD<1:M> to generate the read signal RD which is enabled to have a logic "high" level.

The read control circuit 130 may generate the first read enablement signal RD_EN<1> which is enabled to have a logic "high" level based on the read signal RD having a logic "high" level and the $N^{th}$ address signal ADD<N> having a logic "low" level.

The first memory region 320 may output the first to sixteenth internal data ID<1:16> stored in memory cells included in the first to fourth arrays ARRAY1~ARRAY4, which are selected by the first to $N^{th}$ address signals ADD<1:N>.

The first parity region 361 of the first fail information storage region 360 may output the first to fifth internal parities IP<1:5> stored in memory cells selected by the first to $N^{th}$ address signals ADD<1:N>.

The first I/O circuit 310 may generate the first to sixteenth transmission data TD<1:16> from the first to sixteenth internal data ID<1:16> because the first read enablement signal RD_EN<1> is enabled to have a logic "high" level.

The first driver 351 of the parity I/O circuit 350 may generate the first to fifth parities PRT<1:5> from the first to fifth internal parities IP<1:5> because the first read enablement signal RD_EN<1> is enabled to have a logic "high" level.

The error correction circuit 20 may correct an error of the first to sixteenth transmission data TD<1:16> using an error correction code (ECC) based on the first to fifth parities PRT<1:5> to generate and output the first to sixteenth data DATA<1:16>.

Next, in order to perform the read operation applied to the second memory region 340 of the first core circuit 30, the command decoder 110 may decode the first to $M^{th}$ commands CMD<1:M> to generate the read signal RD which is enabled to have a logic "high" level.

The read control circuit 130 may generate the second read enablement signal RD_EN<2> which is enabled to have a logic "high" level based on the read signal RD having a logic "high" level and the $N^{th}$ address signal ADD<N> having a logic "high" level.

The second memory region 340 may output the seventeenth to thirty second internal data ID<17:32> stored in memory cells included in the fifth to eighth arrays ARRAY5~ARRAY8, which are selected by the first to $N^{th}$ address signals ADD<1:N>.

The second parity region 362 of the first fail information storage region 360 may output the sixth to tenth internal parities IP<6:10> stored in memory cells selected by the first to $N^{th}$ address signals ADD<1:N>.

The second I/O circuit 330 may generate the first to sixteenth transmission data TD<1:16> from the seventeenth to thirty second internal data ID<17:32> because the second read enablement signal RD_EN<2> is enabled to have a logic "high" level.

The second driver 352 of the parity I/O circuit 350 may generate the first to fifth parities PRT<1:5> from the sixth to tenth internal parities IP<6:10> because the second read enablement signal RD_EN<2> is enabled to have a logic "high" level.

The error correction circuit 20 may correct an error of the first to sixteenth transmission data TD<1:16> using an error correction code (ECC) based on the first to fifth parities PRT<1:5> to generate and output the first to sixteenth data DATA<1:16>.

According to the semiconductor device described above, spaces for storing parities corresponding to fail information of data may be separately provided, and the spaces storing the parities of respective ones of memory regions may be separated from each other.

Figure 10:
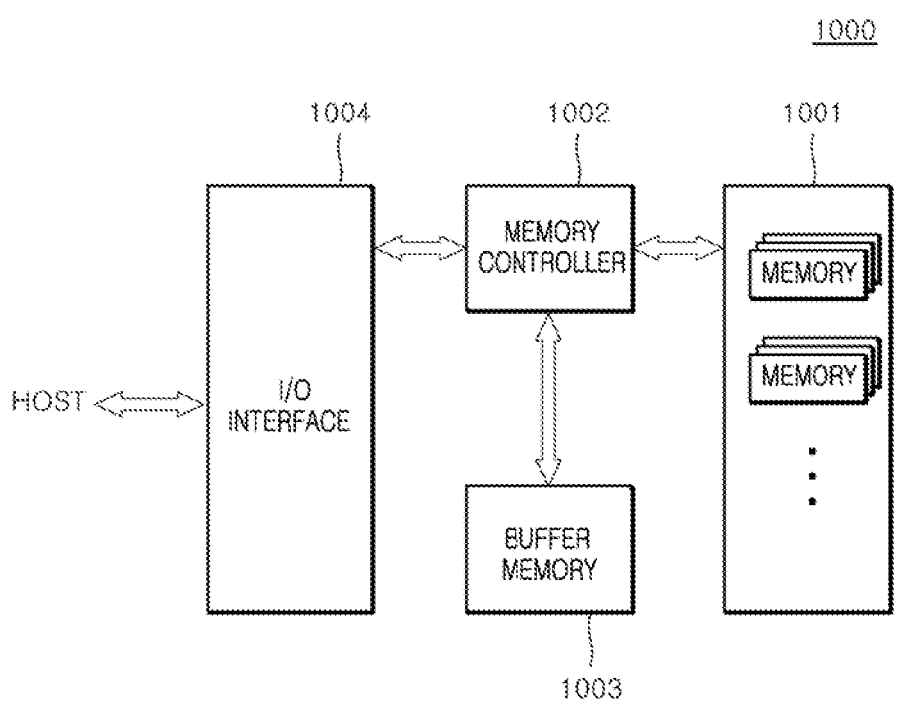
FIG. 10 is a block diagram illustrating a configuration of an electronic system employing the semiconductor device described with reference to FIGS. 1 to 9.

The semiconductor system described with reference to FIGS. 1 to 9 may be applied to an electronic system that includes a memory system, a graphic system, a computing system, a mobile system, or the like. For example, as illustrated in FIG. 10, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the first semiconductor device 1 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a first memory region and a second memory region spaced apart from each other; and
a fail information storage region disposed between the first and second memory regions,
wherein a parity including error information on data is stored in a first parity region of the fail information storage region while a write operation is applied to the first memory region,
wherein the parity is stored in a second parity region of the fail information storage region while the write operation is applied to the second memory region,
wherein an error of the data is corrected by the parity stored in the first parity region while a read operation is applied to the first memory region, and
wherein the error of the data is corrected by the parity stored in the second parity region while the read operation is applied to the second memory region.

2. The semiconductor device of claim 1,
wherein a distance between the first parity region and the first memory region is less than a distance between the second parity region and the first memory region; and
wherein a distance between the second parity region and the second memory region is less than a distance between the first parity region and the second memory region.

3. The semiconductor device of claim 1,
wherein the number of bits included in the parity is set to be "N" when the number of bits included in the data is "M";
wherein the number of bits included in the parity is set to be "N+1" when the number of bits included in the data is "2×M";
wherein "N" and "M" are natural numbers.

4. The semiconductor device of claim 1, further comprising:
a control circuit configured to generate a first write enablement signal and a second write enablement signal, one of which is selectively enabled according to a logic level of an address signal during the write operation activated by a command, and configured to generate a first read enablement signal and a second read enablement signal, one of which is selectively enabled according to a logic level of the address signal during the read operation activated by the command; and
an error correction circuit configured to generate the parity of the data and to generate transmission data from the data during the write operation and configured to correct an error of the transmission data using the parity to output the corrected transmission data as the data during the read operation.

5. The semiconductor device of claim 4, wherein the address signal is set to have at least one bit for selecting any one of the first and second memory regions.

6. The semiconductor device of claim 4, wherein the control circuit comprises:
a command decoder configured to decode the command to generate a write signal and a read signal;
a write control circuit configured to generate the first and second write enablement signals, one of which is selectively enabled according to a logic level of the address signal when the write signal is inputted to the write control circuit; and
a read control circuit configured to generate the first and second read enablement signals, one of which is selectively enabled according to a logic level of the address signal when the read signal is inputted to the read control circuit.

7. The semiconductor device of claim 6, wherein the write control circuit comprises:
a first logic circuit configured to generate the first write enablement signal, wherein the first write enablement signal is enabled when the write signal is inputted to the first logic circuit and the address signal is generated to have a first logic level; and
a second logic circuit configured to generate the second write enablement signal, wherein the second write enablement signal is enabled when the write signal is inputted to the second logic circuit and the address signal is generated to have a second logic level.

8. The semiconductor device of claim 6, wherein the read control circuit comprises:
a third logic circuit configured to generate the first read enablement signal, wherein the first read enablement signal is enabled when the read signal is inputted to the third logic circuit and the address signal is generated to have a first logic level; and a fourth logic circuit configured to generate the second read enablement signal, wherein the second read enablement signal is enabled when the read signal is inputted to the fourth logic circuit and the address signal is generated to have a second logic level.

9. The semiconductor device of claim 1, further comprising:

a first input/output (I/O) circuit configured to generate first internal data from transmission data generated from the data during the write operation applied to the first memory region and configured to generate the transmission data from the first internal data during the read operation applied to the first memory region;

a second I/O circuit configured to generate second internal data from the transmission data during the write operation applied to the second memory region and configured to generate the transmission data from the second internal data during the read operation applied to the second memory region; and a parity I/O circuit configured to generate a first internal parity from the parity during the write operation applied to the first memory region, configured to generate the parity from the first internal parity during the read operation applied to the first memory region, configured to generate a second internal parity from the parity during the write operation applied to the second memory region, and configured to generate the parity from the second internal parity during the read operation applied to the second memory region.

10. The semiconductor device of claim 9, wherein the parity I/O circuit comprises:

a first driver configured to generate the first internal parity from the parity when a first write enablement signal is inputted to the first driver and configured to generate the parity from the first internal parity when a first read enablement signal is inputted to the first driver; and a second driver configured to generate the second internal parity from the parity when a second write enablement signal is inputted to the second driver and configured to generate the parity from the second internal parity when a second read enablement signal is inputted to the second driver.

11. A semiconductor device comprising:

a first memory region and a second memory region configured to store transmission data having "M"-number of bits during a write operation and configured to output the stored transmission data during a read operation; and a first fail information storage region including a first parity region and a second parity region, wherein the first and second parity regions are configured to store a parity having "N"-number of bits during the write operation and configured to output the stored parity during the read operation, wherein the first parity region is configured to store or output the parity generated during the write operation or the read operation which is applied to the first memory region, wherein the second parity region is configured to store or output the parity generated during the write operation or the read operation which is applied to the second memory region, and wherein "N" and "M" are natural numbers, and wherein the first fail information storage region is disposed between the first memory region and the second memory region.

12. The semiconductor device of claim 11, wherein a distance between the first parity region and the first memory region is less than a distance between the second parity region and the first memory region; and wherein a distance between the second parity region and the second memory region is less than a distance between the first parity region and the second memory region.

13. The semiconductor device of claim 11, wherein the number "M" of bits included in the transmission data is set to be equal to the number of bits of data which are inputted to or outputted from the semiconductor device by a single cycle of the write operation or the read operation; and wherein the number "N" of bits included in the parity is set such that the parity includes error information of the transmission data.

14. The semiconductor device of claim 11, wherein when the number of bits included in the transmission data is set to be "2×M", and the number of bits included in the parity is set to be "N+1".

15. The semiconductor device of claim 11, further comprising:

a first control circuit configured to generate a first write enablement signal and a second write enablement signal, one of which is selectively enabled according to a logic level of an address signal during the write operation activated by a command, and configured to generate a first read enablement signal and a second read enablement signal, one of which is selectively enabled according to a logic level of the address signal during the read operation activated by the command; and an error correction circuit configured to generate the parity of data and to generate the transmission data from the data during the write operation and configured to correct an error of the transmission data using the parity to output the corrected transmission data as the data during the read operation.

16. The semiconductor device of claim 15, wherein the address signal is set to have at least one bit for selecting any one of the first and second memory regions.

17. The semiconductor device of claim 15, wherein the first control circuit comprises:

a first command decoder configured to decode the command to generate a first write signal and a first read signal;

a first write control circuit configured to generate the first and second write enablement signals, one of which is selectively enabled according to a logic level of the address signal when the first write signal is inputted to the first write control circuit; and a first read control circuit configured to generate the first and second read enablement signals, one of which is selectively enabled according to a logic level of the address signal when the first read signal is inputted to the first read control circuit.

18. The semiconductor device of claim 11, further comprising:

a first input/output (I/O) circuit configured to generate first internal data from the transmission data during the write operation applied to the first memory region and configured to generate the transmission data from the first internal data during the read operation applied to the first memory region;

a second I/O circuit configured to generate second internal data from the transmission data during the write operation applied to the second memory region and configured to generate the transmission data from the second internal data during the read operation applied to the second memory region; and a first parity I/O circuit configured to generate a first internal parity from the parity during the write operation applied to the first memory region, configured to generate the parity from the first internal parity during the read operation applied to the first memory region, configured to generate a second internal parity from the parity during the write operation applied to the second memory region, and configured to generate the parity from the second internal parity during the read operation applied to the second memory region.

19. The semiconductor device of claim 18, wherein the first parity I/O circuit comprises:

a first driver configured to generate the first internal parity from the parity when a first write enablement signal is inputted to the first driver and configured to generate the parity from the first internal parity when a first read enablement signal is inputted to the first driver; and a second driver configured to generate the second internal parity from the parity when a second write enablement signal is inputted to the second driver and configured to generate the parity from the second internal parity when a second read enablement signal is inputted to the second driver.

20. The semiconductor device of claim 11, further comprising:

a third memory region and a fourth memory region configured to store the transmission data during the write operation and configured to output the stored transmission data during the read operation; and a second fail information storage region including a third parity region and a fourth parity region which are configured to store the parity during the write operation and configured to output the stored parity during the read operation, wherein the third parity region is configured to store or output the parity generated during the write operation or the read operation which is applied to the third memory region, and wherein the fourth parity region is configured to store or output the parity generated during the write operation or the read operation which is applied to the fourth memory region.

21. The semiconductor device of claim 20, wherein the second fail information storage region is disposed between the third memory region and the fourth memory region.

22. The semiconductor device of claim 20, wherein a distance between the third parity region and the third memory region is less than a distance between the fourth parity region and the third memory region; and wherein a distance between the fourth parity region and the fourth memory region is less than a distance between the third parity region and the fourth memory region.

23. The semiconductor device of claim 20, further comprising a second control circuit configured to generate a third write enablement signal and a fourth write enablement signal, one of which is selectively enabled according to a logic level of an address signal during the write operation activated by a command, and configured to generate a third read enablement signal and a fourth read enablement signal, one of which is selectively enabled according to a logic level of the address signal during the read operation activated by the command.

24. The semiconductor device of claim 23, wherein the address signal is set to have at least one bit for selecting any one of the third and fourth memory regions.

25. The semiconductor device of claim 23, wherein the second control circuit comprises:

a second command decoder configured to decode the command to generate a second write signal and a second read signal;

a second write control circuit configured to generate the third and fourth write enablement signals, one of which is selectively enabled according to a logic level of the address signal when the second write signal is inputted to the second write control circuit; and a second read control circuit configured to generate the third and fourth read enablement signals, one of which is selectively enabled according to a logic level of the address signal when the second read signal is inputted to the second read control circuit.

26. The semiconductor device of claim 20, further comprising:

a third I/O circuit configured to generate third internal data from the transmission data during the write operation applied to the third memory region and configured to generate the transmission data from the third internal data during the read operation applied to the third memory region;

a fourth I/O circuit configured to generate fourth internal data from the transmission data during the write operation applied to the fourth memory region and configured to generate the transmission data from the fourth internal data during the read operation applied to the fourth memory region; and a second parity I/O circuit configured to generate a third internal parity from the parity during the write operation applied to the third memory region, configured to generate the parity from the third internal parity during the read operation applied to the third memory region, configured to generate a fourth internal parity from the parity during the write operation applied to the fourth memory region, and configured to generate the parity from the fourth internal parity during the read operation applied to the fourth memory region.

27. The semiconductor device of claim 26, wherein the second parity I/O circuit comprises:

a third driver configured to generate the third internal parity from the parity when a third write enablement signal is inputted to the third driver and configured to generate the parity from the third internal parity when a third read enablement signal is inputted to the third driver; and a fourth driver configured to generate the fourth internal parity from the parity when a fourth write enablement signal is inputted to the fourth driver and configured to generate the parity from the fourth internal parity when a fourth read enablement signal is inputted to the fourth driver.

* * * * *